United States Patent
Hsiao et al.

(10) Patent No.: US 8,777,437 B2
(45) Date of Patent: Jul. 15, 2014

(54) LIGHT-EMITTING MODULE

(75) Inventors: Zhi-Cheng Hsiao, Changhua County (TW); Chao-Kai Hsu, Hsinchu County (TW); Yu-Hua Chen, Nantou County (TW)

(73) Assignee: Industrial Technology Research Institute, Hsinchu (TW)

( * ) Notice: Subject to any disclaimer, the term of this patent is extended or adjusted under 35 U.S.C. 154(b) by 1324 days.

(21) Appl. No.: 12/046,419

(22) Filed: Mar. 11, 2008

(65) Prior Publication Data

US 2009/0116244 A1    May 7, 2009

(30) Foreign Application Priority Data

Nov. 6, 2007 (TW) ................. 96141847 A

(51) Int. Cl.
*G09F 13/04* (2006.01)

(52) U.S. Cl.
USPC ........................................ 362/97.3; 362/252

(58) Field of Classification Search
USPC ................ 362/97.3, 97.2, 97.1, 252, 237
See application file for complete search history.

(56) References Cited

U.S. PATENT DOCUMENTS

| | | | |
|---|---|---|---|
| 6,665,038 B2 | 12/2003 | Endo | |
| 6,906,761 B2 | 6/2005 | Nakano | |
| 6,930,737 B2 | 8/2005 | Weindorf et al. | |
| 6,999,318 B2 * | 2/2006 | Newby | 361/719 |
| 2004/0130912 A1 * | 7/2004 | Miyashita | 362/561 |
| 2005/0265029 A1 * | 12/2005 | Epstein et al. | 362/339 |
| 2007/0019394 A1 * | 1/2007 | Park et al. | 362/29 |

FOREIGN PATENT DOCUMENTS

| | | |
|---|---|---|
| TW | M266469 | 6/2005 |
| TW | 200600927 | 1/2006 |
| TW | 200728851 | 8/2007 |

OTHER PUBLICATIONS

"Office Action of Taiwan Counterpart Application", issued on Dec. 20, 2011, p. 1-p. 6, in which the listed references were cited.

* cited by examiner

*Primary Examiner* — Julie Bannan
(74) *Attorney, Agent, or Firm* — Jianq Chyun IP Office

(57) ABSTRACT

A light-emitting module includes a substrate having a first surface and a second surface, at least one light-emitting device disposed on the first surface of the substrate, and an optical reflection layer disposed on the first surface of the substrate and surrounding the light-emitting device for receiving a portion of light emitted from the light-emitting device and reflecting the portion of light. The substrate can be rigid or flexible.

19 Claims, 3 Drawing Sheets

LIGHT-EMITTING MODULE

CROSS-REFERENCE TO RELATED APPLICATION

This application claims the priority benefit of Taiwan application serial no. 96141847, filed on Nov. 6, 2007. The entirety the above-mentioned patent application is hereby incorporated by reference herein and made a part of specification.

BACKGROUND OF THE INVENTION

1. Field of the Invention

The present invention relates to a light-emitting module. The light-emitting module may be rigid or flexible.

2. Description of Related Art

Utilization of light-emitting module is diversified, for example, the light-emitting module may be applied to a display to function as a backlight module. 97% of the backlights utilized in liquid crystal displays (LCDs) of personal computer in the market are cold cathode fluorescent lamps (CCFLs). Light-emitting diodes (LEDs) are mainly applied to displays with sizes less than 7 inches, and application of the LEDs on large size LCDs is still under development. Since the LEDs for RGB have been applied to LCD televisions (TV), and have the advantages of wide color gamut, environmental protection, long lifespan, fast response, high dynamic contrast etc., conventional CCFL backlight may be gradually substituted by LED backlight. As to a LCD TV, an edge-emitting RGB LED backlight module is applied to LCD panel thereof, in which a light guide plate is required to convert a line light source into a planar light source, and therefore loss of light is relatively large, and it is not suitable for a large size TV panel. Correspondingly, a direct-under type LED may satisfy a requirement of the large sized TV panel.

FIG. 1 is a perspective view of a conventional LCD. Referring to FIG. 1, the LCD 10 equipped with a backlight module includes a flexible board 11, a backlight conductor 12, a rod light transmitter 13, a LCD panel 14, a spur 15 and a LED 16, wherein the LED 16 is the edge-emitting LED, and may be converted to a planar light source via the backlight transmitter 12 and the rod light transmitter 13 for providing the light source to the LCD panel 14. The LED 16 is set as an edge-emitting structure via the spur 15 to reduce thickness of the display, though a light-emitting efficiency thereof is relatively low.

Since light emitting of a LED chip is non-directional, front light emitting amount of the LED chip is limited. Further additionally, due to an absorption effect of a LED substrate, loss of light within the LED due to internal light absorption is relatively great, and in terms of external, the light-emitting efficiency thereof is rather low. Presently, most manufactures try to improve the light-emitting efficiency and reduce light absorption of the LED substrate, and a method thereof is utilizing a substrate transfer technique or coating a mirror layer on the LED substrate. Moreover, to improve a heat-dissipating efficiency of the LED, thermal substrate or coating of thermal paste are generally utilized, however, the thermal effect thereof is limited. As to a large sized luminescent panel, since the large size luminescent panel is manually arranged in an array, productivity thereof is relatively low, and man-power cost is relatively high.

In addition, in one of the conventional techniques, light emitted from the LED may be reflected and guided into a light pipe. This technique belongs to the edge-emitting LED backlight source, by which reflection effect and light-emitting volume of the LED may be improved based on adjustment of whole structure thereof and association with other devices. Another conventional technique belongs to a lamp edge-emitting backlight source including a lamp, a light guide plate, a diffusion plate, a prism sheet, and a reflection sheet. In this technique, the reflection sheet is applied for preventing scratches on backside of the light guide plate, and improving the front light-emitting volume of the backlight source. The advantage of this conventional technique is that fabrication method thereof is relatively mature, and integration of components therein is relatively easy. The reflection sheet is used for compensating the loss of light occurred during incidence of the light into the light guide plate, so as to improve the front light-emitting volume of the backlight source.

Therefore, how to improve the light-emitting efficiency, the heat-dissipating efficiency, and to thin the light-emitting module to achieve the flexible effect is still an issue under development.

SUMMARY OF THE INVENTION

The present invention is directed to a light-emitting module, which may improve a heat-dissipating efficiency of a large sized soft backlight source module, and improve a front light-emitting efficiency thereof, and has a structure designed to be integrated into the integrated circuits to facilitate the production.

The present invention provides a light-emitting module including a substrate having a first surface and a second surface, at least a light-emitting device disposed on the first surface of the substrate, and an optical reflection layer disposed on the first surface of the substrate and surrounding the light-emitting device for receiving a portion of light emitted from the light-emitting device and reflecting the portion of light.

The substrate may be rigid or flexible. In case of flexibility, a flexible display panel may be applied for providing a required flexible light source.

In order to make the aforementioned and other objects, features and advantages of the present invention comprehensible, a preferred embodiment accompanied with figures is described in detail below.

DESCRIPTION OF EMBODIMENTS

The present invention provides a light-emitting module composed of light-emitting devices. The light-emitting devices may be LEDs. The light-emitting module may be a rigid or a flexible structure. A plurality of LEDs forms an array for providing a planar light source, wherein the planar light source may be bended and function as a backlight source for a flexible display. The present invention will now be described with reference of the following embodiments, though the present invention is not limited thereto.

Figure 1:
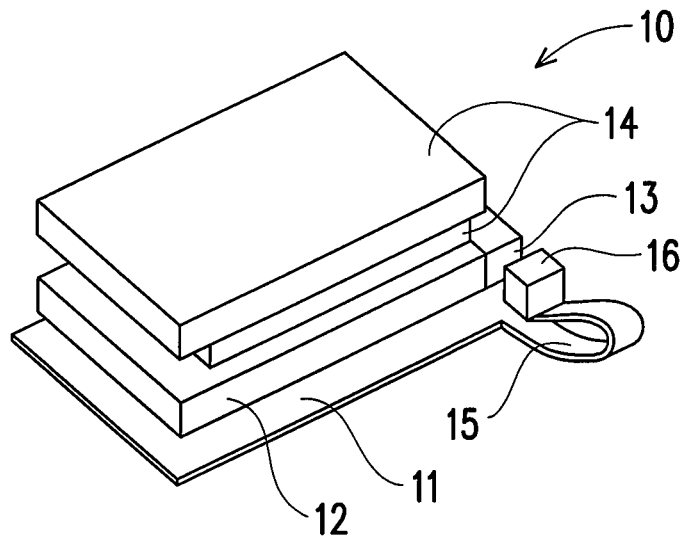
FIG. 1 is a perspective view of a conventional LCD.
Figure 2:
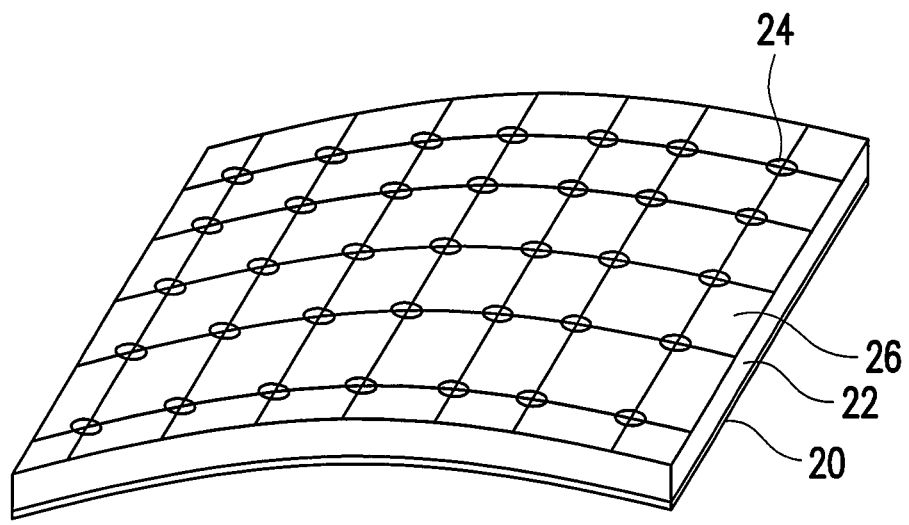
FIG. 2 is a structural diagram of a light-emitting module according to an embodiment of the present invention.

FIG. 2 is a structural diagram of a light-emitting module according to an embodiment of the present invention. Referring to FIG. 2, the light-emitting module may be a flexible light-emitting module, as an example, and includes a substrate 22 having a first surface and a second surface. At least a light-emitting device 24 is disposed on the first surface of the substrate 22, and an optical reflection layer 26 is disposed on the first surface of the substrate 22 and surrounding the light-emitting device 22 for receiving a portion of light emitted from the light-emitting device 24 and reflecting the portion of light. The substrate 22 may be flexible or rigid.

It can be understood that the substrate 22 may further include other components, such as leading wires, integrated circuit (IC) driven by the leading wires, and structures for fixing and connecting the light-emitting device 24. The light-emitting device 24 may be a LED. These structures will be briefly described with reference of FIG. 6, and detailed description thereof is known by those with ordinary skill in the art, and will not be further described.

The light-emitting device 24 is basically a point light source, which may be arranged in an array, and is suitable for a flexible structure. Moreover, to improve a heat-dissipating effect, a thermal conductive material layer 20 may further be disposed on the back of the substrate 22. The thermal conductive material may be, for example, metal or polymer material.

As to a design of the flexible substrate 22, a curvature radius thereof may be 5 cm or more. The material of the flexible substrate 22 may be, for example, metal or polymer material. However, since leading wires used for driving the light-emitting device 24 are disposed on the substrate 22, if a metal substrate 22 is applied, structure of the leading wires is required to be properly modified and insulated. The metal substrate 22 may even function as an electrode, for example, function as a common cathode.

Figure 3:
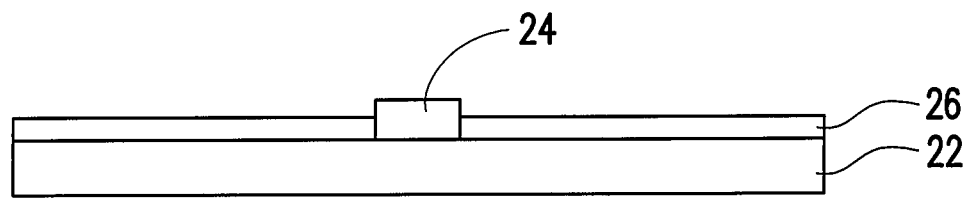
FIG. 3 is a cross-sectional view of a light-emitting module according to an embodiment of the present invention.
Figure 4:
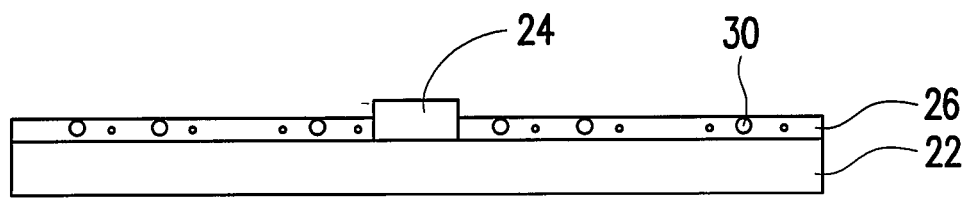
FIG. 4 is a cross-sectional view of a light-emitting module according to another embodiment of the present invention.
Figure 5:
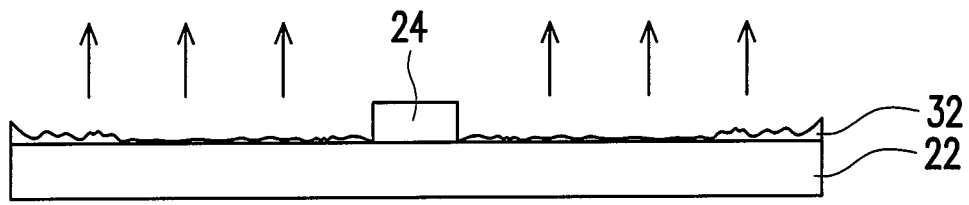
FIG. 5 is a cross-sectional view of a light-emitting module according to still another embodiment of the present invention.

Design of the optical reflection layer has various choices. FIGS. 3-5 are cross-sectional views of light-emitting modules according to different embodiments of the present invention. Referring to FIG. 3, when the substrate does not have a reflection structure, the optical reflection layer 26 may be a metal layer or a laminated optical module. The laminated optical module is formed by stacking materials with different refraction coefficients, so as to achieve the reflection effect. The light emitted from the light-emitting device 24 is generally non-directional, and therefore a portion of the light may enter the optical reflection layer 26. The optical reflection layer 26 then reflects the incident light to form a part of the light source, so as to avoid waste of the light source.

Referring to FIG. 4, the basic structure of the light-emitting module is maintained as that shown in FIG. 3, while the optical reflection layer 26 has some modifications. Material of the optical reflection layer 26 may be transparent polymer material. The optical reflection layer 26 may include a plurality of micro lenses 30 distributed within the transparent polymer material layer. Sizes of the micro lenses 30 may be different, and shapes of the micro lenses 30 are optional, wherein the preferable shapes are spheres or combinations of a plurality of different shapes. By applying the micro lenses 30, the light may be uniformly reflected to provide the planar light source.

Referring to FIG. 5, the basic structure of the light-emitting module is maintained as that shown in FIG. 3, while an optical reflection layer 32 has some modifications. The optical reflection layer 32 is designed to have a surface structure, so as to increase a front reflection of the reflected light.

Basically, the optical reflection layer may have both a reflection function and a spread function. The spread function may increase a light uniformity of the planar light source. Moreover, the optical reflection layer 26 and the substrate 22 may function in coordination with one another, or even may form an integrated structure. Based on chip packaging technique, after the light-emitting device 24 is fixed to the circuit on the substrate 22, the optical reflection layer 26 then may be formed by coating the polymer materials and performing a drying process, or by performing a metal vapour deposition process. The optical reflection layer 26 may be fabricated by usual fabrication technique while maintaining designed functions thereof, by which special fabrication process and special material selection are unnecessary.

Figure 6:
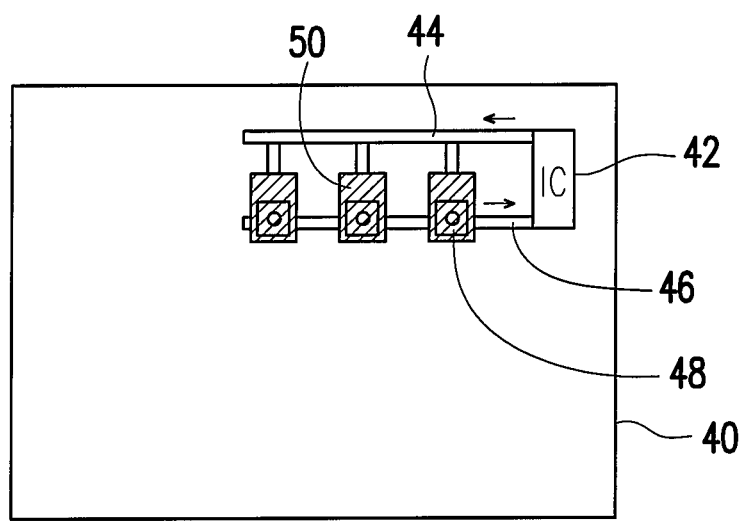
FIG. 6 is a circuit diagram of a light-emitting module according to an embodiment of the present invention.

FIG. 6 is a circuit diagram of a light-emitting module according to an embodiment of the present invention. Referring to FIG. 6, a substrate 40 includes an IC 42 functioning as a driving circuit, metal leading wires 44 and 46 for providing an operation voltage to LEDs 50. The LEDs 50 are fixed on pads 48. The LEDs 50 may be connected to the metal leading wires 44 and 46 based on a die bond technique. The LEDs 50 may also be disposed on the substrate 40 based on an eutectic die bond technique, a flip chip bond technique or a wire bonding technique, etc. As described above, fixing and connecting the circuit and the LEDs 50 on the substrate 40 may be implemented based on usual techniques, and therefore it basically does not cause additional fabrication process and extra cost.

As shown in FIG. 2, the light-emitting devices 24 are regional point light source, though the light emitted from the light source are diffused, light intensities of different light-emitting devices 24 may be different, which may cause uneven of the light intensity. Though the optical reflection layer 26 may adjust the light intensity to achieve a relatively uniform effect, in a close distance, the light-emitting device 24 is still the regional light source, and uneven of the light source is inevitable. If the light-emitting device 24 is applied to the display to function as the backlight source, uneven luminance phenomenon may be induced. To mitigate the uneven luminance phenomenon, an optical diffusion sheet may be applied to uniform the luminance.

Figure 7:
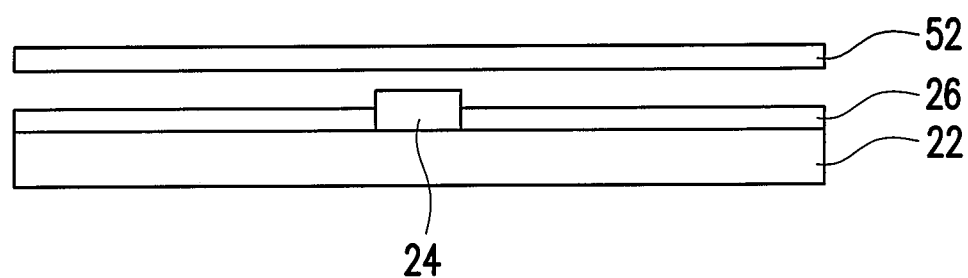
FIG. 7 is a cross-sectional view of a light-emitting module according to an embodiment of the present invention.

FIG. 7 is a cross-sectional view of a light-emitting module according to an embodiment of the present invention. Referring to FIG. 7, besides the substrate 22, the optical reflection layer 26 and the light-emitting device 24, an optical diffusion sheet 52 is further provided. The optical diffusion sheet 52 is attached or coated on the top of the substrate 22 for reducing a light intensity ratio between an axial light intensity and a surrounding light intensity of the light-emitting device 24, so as to increase the light uniformity of the planar light source. Moreover, the optical diffusion sheet 52 may include optical diffusion particles for increasing the light uniformity.

The optical diffusion sheet 52 may achieve its function when being disposed apart from the light-emitting device 24 by a distance. To achieve the required distance, a spacer may be disposed there between or the distance may be formed via the thickness of an adhesive layer, and forming of the distance may be achieved by usual techniques, which are not limited in the present invention. Modified based on experiment, the optical diffusion sheet 52 may achieve its function, and the optical diffusion sheet 52 may be composed of a plurality of parallel prism sheets.

The light-emitting module of the present invention may be applied to the rigid substrate and the flexible substrate, while still maintaining a relatively high light-emitting rate and light uniformity. Therefore, in coordination with a flexible display device, the light-emitting module may function as the backlight source thereof.

To increase the front light-emitting volume, an optical film layer with a high reflectivity may be, for example, disposed around the light-emitting devices for improving the front light-emitting volume.

To increase the front light-emitting volume, a transparent polymer material layer including a plurality of micro lenses may be, for example, disposed around the light-emitting devices. The micro lenses may improve reflection and refraction of the light, so as to improve the front light-emitting volume.

To increase the front light-emitting volume, shapes of optical reflection film disposed around the light-emitting device may be, for example, designed to achieve multiple reflection of the light by the reflection film, so as to improve light utilization efficiency.

Moreover, besides design of the reflection layer, a thermal conductive layer may further be, for example, applied for increasing a heat-dissipating effect and improving the heat-dissipating efficiency, so as to improve the light-emitting efficiency and lifespan of the light-emitting device.

In addition, applying of the diffusion sheet may also improve the front light-emitting efficiency and the light uniformity.

The light-emitting module of the present invention may be, for example, applied to the display to function as the backlight source.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting module, comprising:
a substrate, having a first surface and a second surface;
at least a light-emitting device, disposed on the first surface of the substrate; and
an optical reflection layer, disposed on the first surface of the substrate for receiving a portion of light emitted from the light-emitting device and reflecting the portion of light, wherein at least a portion of the optical reflection layer in height is lower than the top of the light-emitting device and the optical reflection layer further comprises:
a transparent polymer material layer; and
a plurality of micro lenses distributed within the transparent polymer material layer.

2. The light-emitting module as claimed in claim 1, wherein the substrate is a rigid substrate.

3. The light-emitting module as claimed in claim 1, wherein the substrate is a flexible substrate.

4. The light-emitting module as claimed in claim 3, wherein a curvature radius of the flexible substrate is 5 cm or more.

5. The light-emitting module as claimed in claim 3, wherein material of the flexible substrate comprises metal and polymer material.

6. The light-emitting module as claimed in claim 1, wherein the micro lenses are of spherical shapes or a combination of different shapes.

7. The light-emitting module as claimed in claim 1, wherein the optical reflection layer has both a reflection function and a diffusion function.

8. The light-emitting module as claimed in claim 7, wherein the diffusion function of the optical reflection layer is used for improving a light uniformity of a planar light source.

9. The light-emitting module as claimed in claim 1, wherein material of the substrate comprises polymer material or metal thin film material.

10. The light-emitting module as claimed in claim 1, further comprising a thermal conductive layer disposed on the second surface of the substrate.

11. The light-emitting module as claimed in claim 10, wherein material of the thermal conductive layer is metal.

12. The light-emitting module as claimed in claim 10, wherein material of the thermal conductive layer is polymer material.

13. The light-emitting module as claimed in claim 1, further comprising an optical diffusion sheet disposed over the first surface of the substrate for reducing a light intensity ratio between an axial light intensity and a surrounding light intensity of the light-emitting device, so as to increase the light uniformity of the planar light source.

14. The light-emitting module as claimed in claim 13, wherein the optical diffusion sheet comprises optical diffusion particles.

15. The light-emitting module as claimed in claim 1, wherein the light-emitting device comprises a light-emitting diode.

16. The light-emitting module as claimed in claim 1, wherein the light-emitting devices are arranged in an array to form a light-emitting plane.

17. The light-emitting module as claimed in claim 1, wherein a leading wire structure is disposed on the substrate for providing a driving power to the light-emitting device.

18. A light-emitting module, comprising:
a substrate, having a first surface and a second surface;
at least a light-emitting device, disposed on the first surface of the substrate; and
an optical reflection layer, disposed on the first surface of the substrate for receiving a portion of light emitted from the light-emitting device and reflecting the portion of light, wherein at least a portion of the optical reflection layer in height is lower than the top of the light-emitting device and the optical reflection layer further has a roughen surface structure for increasing a front reflection of reflected light.

19. The light-emitting module as claimed in claim 18, wherein a periphery region of the roughen surface structure with respect to the light-emitting device is higher than the central region.

* * * * *